(12) United States Patent
Thomas et al.

(10) Patent No.: US 6,628,500 B1
(45) Date of Patent: Sep. 30, 2003

(54) METHOD AND APPARATUS FOR DECHUCKING A SUBSTRATE FROM AN ELECTROSTATIC CHUCK

(75) Inventors: Tudor Thomas, Cardiff (GB); Robert John Williams, Gwent (GB)

(73) Assignee: Surface Technology Systems PLC, Gwent (GB)

( * ) Notice: Subject to any disclaimer, the term of this patent is extended or adjusted under 35 U.S.C. 154(b) by 0 days.

(21) Appl. No.: 09/719,500

(22) PCT Filed: Jun. 15, 1999

(86) PCT No.: PCT/GB99/01896
§ 371 (c)(1),
(2), (4) Date: Mar. 29, 2001

(87) PCT Pub. No.: WO99/66549
PCT Pub. Date: Dec. 23, 1999

(30) Foreign Application Priority Data

Jun. 16, 1998 (GB) .............................................. 9812850

(51) Int. Cl.$^7$ .......................... H01L 21/68; H02N 13/00
(52) U.S. Cl. ........................................ 361/234; 361/230
(58) Field of Search ................................ 361/234, 230, 361/233, 235; 269/8; 279/128

(56) References Cited

U.S. PATENT DOCUMENTS 5,325,261 A * 6/1994 Horwitz ...................... 361/230
5,684,669 A * 11/1997 Collins et al. ............... 361/234
5,699,223 A * 12/1997 Mashiro et al. ............. 361/234

* cited by examiner

Primary Examiner—Kim Huynh
(74) Attorney, Agent, or Firm—Volentine Francos, PLLC

(57) ABSTRACT

There is provided a method of dechucking from an electrostatic chuck a substrate held by one or more residual forces to the chuck, the method comprising the steps of: (a) reducing a residual chucking force due to the electrostatic chuck polarisation; (b) contracting the chuck with the substrate attached thereto with a plasma for a time sufficient substantially to remove any residual charge from the surface of the substrate and the chuck; and (c) subsequently to, or simultaneously with, step (b) removing the substrate from the chuck. Also disclosed is an apparatus for performing the method.

9 Claims, 1 Drawing Sheet

METHOD AND APPARATUS FOR DECHUCKING A SUBSTRATE FROM AN ELECTROSTATIC CHUCK

Figure 1:
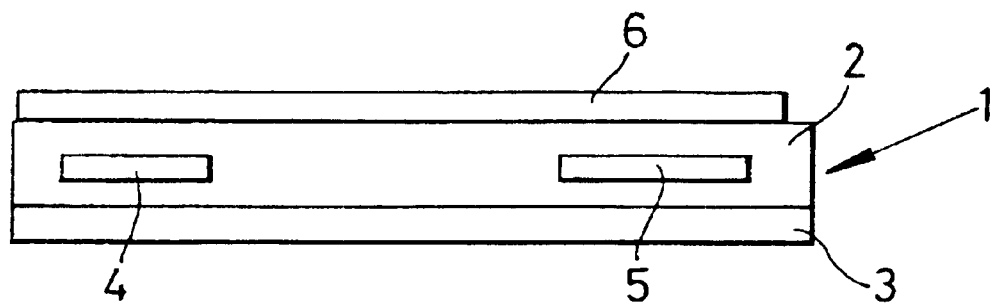

This invention relates to a method and apparatus for dechucking a substrate particularly, although not exclusively, a semi-conductor wafer from an electrostatic chuck.

Electrostatic chucks have been used to hold semiconductor wafers and other materials whilst processing in a vacuum chamber. Electrostatic chucks have been used in some cases in preference to mechanical clamping devices to avoid the need for fingers or the like which may damage the surface of the wafer. However, with the use of electrostatic chucks, it has been found that residual forces holding the wafer to the chuck exist even after the clamping voltage is removed after processing.

U.S. Pat. No. 5,684,669 and U.S. Pat. No. 5,325,261 disclose methods aimed at minimising the residual electrostatic force between the wafer and chuck by applying a voltage, which is typically of the same polarity as (but smaller than) the chucking voltage, during release of the wafer. U.S. Pat. No. 5,684,669 uses the leak rate of gas which seeps through the gap between the wafer and the chuck to measure the residual force indirectly. U.S. Pat. No. 5,325,261 monitors the extent of the residual force indirectly by measuring the chuck capacitance.

U.S. Pat. No. 5,221,450 discloses an electrostatic chucking method in which a chuck is immersed in a plasma without the wafer on it in order to remove the remaining charges before the next wafer is held.

It has been found that there are two main sources of stiction in an electrostatic chuck. The first of these discussed above is the residual electrostatic polarisation, of the dielectric material of the electrostatic chuck itself which causes bound surface charge to bind the wafer by electrostatic attraction. The second source relates to residual free charges which are due to either leakage current through or from the surface of the chuck dielectric or derived from the process itself, which reside on the chuck or the wafer surface. Whilst the first problem is addressed by the methods described in U.S. Pat. No. 5,325,261 and U.S. Pat. No. 5,684,669, it has been found that these methods do not work in an entirely satisfactory manner as they do not address the issue of the second source of stiction before or during wafer removal.

According to a first aspect of the present invention, there is provided a method of dechucking from an electrostatic chuck a substrate held by one or more residual forces to the chuck, the method comprising the steps of:

(a) reducing a residual chucking force due to the electrostatic chuck polarisation;

(b) contacting the chuck with the substrate attached thereto with a plasma for a time sufficient substantially to remove any residual charge from the surface of the substrate and the chuck; and (c) subsequently to, or simultaneously with, step (b) removing the substrate from the chuck.

Preferably, the chuck with the substrate attached thereto is substantially immersed in the plasma.

The contact with or immersion in the plasma may be carried out in any suitable manner, specific examples being immersion in a driven plasma and immersion in, for example, a downstream plasma. Discharging works, for example, both with a coil discharge and a coil and a platen discharge.

The residual chucking force may be the residual electrostatic polarisation referred to above.

The residual chucking force may be minimised by any method known in the art, in particular the methods disclosed in U.S. Pat. No. 5,325,261 and U.S. Pat. No. 5,684,669, and it is therefore not proposed to discuss these in further great detail here. However, it is preferred that the chucking force is minimised by applying a first voltage to the chuck. In a particular embodiment, the preferred magnitude of the first voltage is determined by ramping the voltage down whilst measuring the extent to which the substrate is held to the chuck. Preferably, when a minimum in the residual chucking force is found, the preferred magnitude of the first voltage is held for a desired period. The extent to which the substrate is held may be measured by, for example, the methods disclosed in U.S. Pat. No. 5,325,261 or U.S. Pat. No. 5,684,669. For example, U.S. Pat, No. 5,325,261 monitors the extent of the residual force by measuring the chuck capacitance, as mentioned above. The value of the capacitance depends on how closely the substrate is held to the chuck. As substrates, particularly in the form of wafers, may have some degree of bowing, the force holding the substrate to the chuck may be counteracted by internal stress in the substrate. As the residual clamping force decreases, the substrate's natural bow is restored and as this happens the substrate capacitance may decrease. Alternatively, as described in U.S. Pat. No. 5,684,669, the residual force may be monitored by measuring the leak rate of a gas which seeps through the gap between the substrate and the chuck.

The chuck may be of any appropriate form. Thus, it may be flat as disclosed in U.S. Pat. No. 5,325,261. Alternatively, it may have one or more steps on its upper surface adjacent the substrate, as also disclosed in U.S. Pat. No. 5,325,261, for example around the periphery of the upper surface.

It is to be noted that, in the method of the present invention, the substrate is still present on the chuck on immersion in a plasma. It may also be subsequently lifted whilst being immersed in a plasma.

Any suitable plasma can be used for the contact or immersion. For example, argon or another inert gas may be present to prevent further etching of the substrate. $SF_6$ and/or other electronegative gases (e.g. oxygen) may be present in the plasma and may improve charge removal. Any suitable power which sustains a plasma may be used, but typical examples are within the range 50 W to 800 W.

The time sufficient to remove the residual charge may be determined by monitoring the capacitance of the chuck due to the proximity of the substrate. Any time may be applicable, but it is typically in the range of between about one second and one minute. It has been found that, in one embodiment, the time sufficient substantially to remove the residual charge is typically about one second.

Preferably, a second voltage is applied to the chuck during contact of the chuck and substrate with the plasma. Whilst any suitable voltage may be used (including a zero voltage) for the second voltage, in a preferred embodiment it is the same as the first voltage.

The applicant has found that reversing steps (a) and (b) of the method of the invention does not lead to efficient removal of the residual charges.

According to a second aspect of the present invention, there is provided an apparatus for performing the method described above comprising:

(a) a chamber within which a substrate held on an electrostatic chuck may be processed;

(b) means for reducing a residual force due to the electrostatic chuck; and (c) means for providing a plasma to contact the chuck with the substrate attached thereto or being removed therefrom for a time substantially to remove any residual charge from the surface of the substrate and the chuck.

The apparatus may further comprise means for removing the substrate from the chuck. In a preferred embodiment, means may be provided to apply a voltage to the chuck.

Although the invention has been defined above, it is to be understood that it includes any inventive combination of the features set out above or in the following description.

Figure 2:
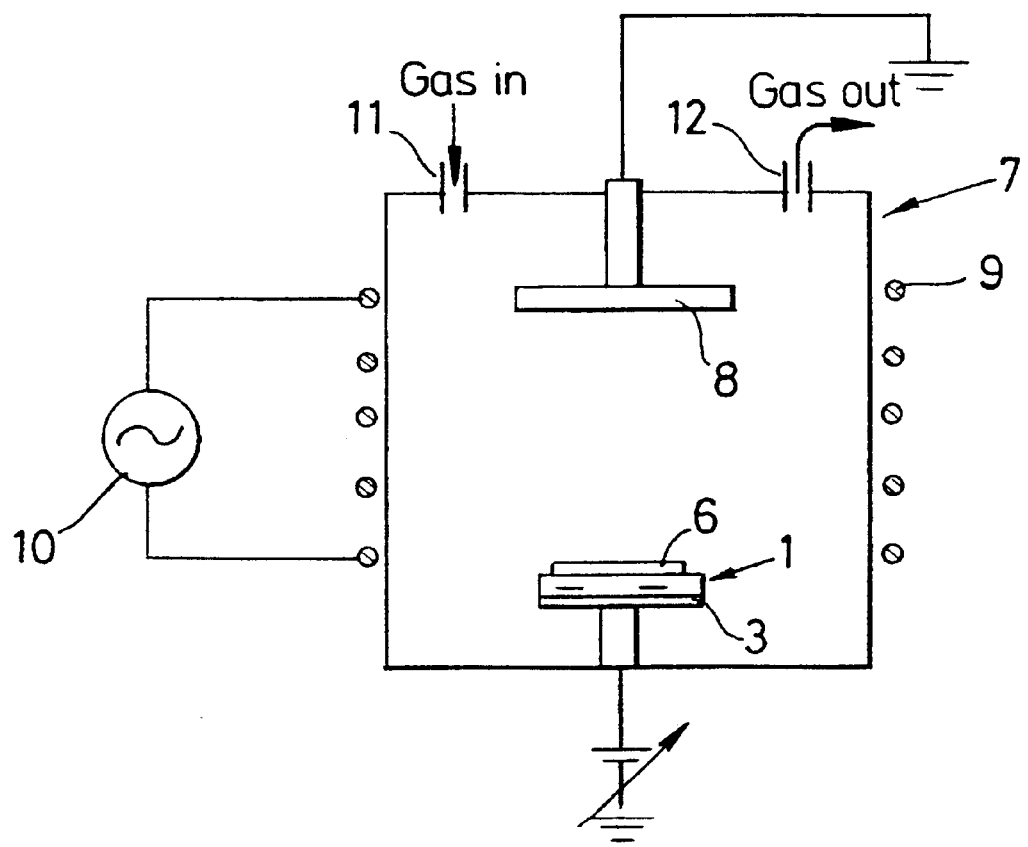

The invention may be performed in various ways and a specific example will now be described, by way of example, with reference to the accompanying drawings, in which:

FIG. 1 is an enlarged cross sectional view of one embodiment of the electrostatic chuck and wafer; and FIG. 2 is a schematic view of one embodiment of an apparatus used in accordance with the invention.

Referring to FIG. 1, there is shown an electrostatic chuck generally at 1. The chuck 1 comprises a dielectric insulator portion 2 having a reference electrode 3 mounted on its lower surface. The dielectric portion 2 has, within its body, electrodes 4 and 5. Although it is not shown in the drawings, a step may be formed around the periphery of the upper surface of the chuck (this aids dechucking by deliberate bow of a wafer positioned on the chuck) Positioned over the electrostatic chuck 1 is a semi conductor wafer 6.

In use, when a voltage is applied to the electrodes 4 and 5, the wafer 6 is held against the upper surface of the chuck 1. Chuck 1 is placed upon the electrode 3 which can either be driven (rf or dc power) or grounded or allowed to electrically float. Indeed chuck 1 can replace the electrode 3 completely in some applications. The applied power to the electrode surface serves (in a triode configuration) to independently (from the plasma excitation power input) bias the electrode to a potential with respect to the grounded surfaces. This potential is typically used to drive ions towards the workpiece.

When the wafer 6 is held to the electrostatic chuck 1 in the manner described above, processing of the wafer, for example by etching or deposition, may be carried out by methods known in the art.

FIG. 2 shows one embodiment of an apparatus in accordance with the invention. A vacuum chamber is shown generally at 7 having the support electrode 3 on which is positioned the electrostatic chuck 1. Also within the chamber is a spaced electrode 8. The wafer 6 is held against the chuck 1 by electrostatic forces as described above. It may be cooled by backside cooling means (not shown). The chamber 7 is surrounded by a coil 9 and fed by an RF source 10 which is used to induce a plasma in the chamber 7 between electrodes 3 and 8 during processing. When immersion in a plasma occurs the inductive discharge in the specific example is typically about 13 cm above the wafer with RF power applied to the chuck 1 and wafer 6, although any value could be used for example from a few cm to greater than 20 cm. The chamber is provided with a gas inlet port 11 through which deposition or etched gases, for example, can be introduced and an exhaust port 12 for the removal of gaseous process products and any excess process gas. The operation of such a reactor in terms of the processing (e.g. etch/deposition) of the wafer 6 is well known in the art.

Once processing of the wafer 6 has been carried out and it is required to dechuck (remove) the wafer 6 from the chuck 1, a value of voltage is determined which may be applied to the electrodes 4 and 5. The magnitude of this voltage can be found by any appropriate means, but one example is by ramping the clamping voltage down whilst measuring the extent to which a wafer is clamped, that is by indirect measurement of the residual clamping force. One example of how this may be carried out has been used in U.S. Pat. No. 5,325,261. When a minimum in the clamping force is indicated the voltage is held at this level. However, as indicated above, the present invention further reduces the stiction in any electrostatic chuck by reducing the residual free charges, due to either leakage current through the chuck dielectric 2 or derived from the process itself, which reside on the chuck and/or wafer surface. Thus, as a subsequent step, the wafer 6 on the electrostatic chuck 1 is "immersed" in a plasma within chamber 7 for a time sufficient to remove the residual charge from the surface of the wafer and the surface of the electrostatic chuck which period is about 1 second in one embodiment. The immersion may be in a driven plasma or, for example, a downstream plasma. A voltage which is found to cancel the residual polarisation as described in U.S. Pat. No. 5,325,261 may be applied to electrodes 4 and 5 in chuck 1 whilst the wafer is immersed in the discharge plasma. However, the voltage can be set to zero during the discharge and then reapplied for removal of wafer 6. Alternatively, the wafer may be removed during the plasma discharge.

When immersion in a downstream plasma occurs the inductive discharge in the example is typically about 13 cm above the wafer with no RF power applied to the wafer. Alternatively, the inductive discharge may typically be about 13 cm above the wafer with RF power applied to the chuck 1 and wafer 6. In both cases, again, any value could be used, for example from a few cm to greater than 20 cm.

What is claimed is:

1. A method of dechucking, from an electrostatic chuck incorporating two electrodes, a substrate held by one or more residual forces to the chuck, the dechucking method comprising the steps of:

(a) reducing a residual chucking force due to the electrostatic chuck polarisation by the application of a first voltage to said two electrodes, the magnitude of the first voltage being determined by ramping the voltage down whilst measuring the extent to which the substrate is held to the chuck;

(b) holding a preferred magnitude of the first voltage for a minimum residual chucking force for a desired period;

(c) as a subsequent step, contacting the chuck with the substrate attached thereto with a plasma for a time sufficient substantially to remove any residual charge from the surface of the substrate and the chuck; and (d) subsequently to, or simultaneously with, step (c) removing the substrate from the chuck.

2. A method according to claim 1, wherein the chuck with the substrate attached thereto is substantially immersed in the plasma.

3. A method according to claim 1, wherein the chuck is contacted with the plasma by immersion in a driven plasma or immersion in a downstream plasma.

4. A method according to claim 1, wherein the extent to which the substrate is held to the chuck is monitored by measuring the chuck capacitance.

5. A method according to claim 1, wherein the extent to which the substrate is held to the chuck is monitored by measuring the leak rate of a gas which seeps through the gap between the substrate and the chuck.

6. A method according to claim 1, wherein the plasma comprises argon, another inert gas, $SF_6$ and/or an electronegative gas.

7. A method according to claim 1, wherein a time sufficient to remove the residual force is determined by monitoring the capacitance of the chuck due to the proximity of the substrate.

8. A method according to claim 1, wherein a second voltage is applied to the chuck during contact of the chuck and substrate with the plasma.

9. A method according to claim 8, wherein the second voltage is the same as the first voltage.

* * * * *